(12) United States Patent
Chen et al.

(10) Patent No.: US 11,968,800 B2
(45) Date of Patent: Apr. 23, 2024

(54) CENTRIFUGAL HEAT DISSIPATION FAN AND HEAT DISSIPATION SYSTEM OF ELECTRONIC DEVICE

(71) Applicant: Acer Incorporated, New Taipei (TW)

(72) Inventors: Tsung-Ting Chen, New Taipei (TW); Wen-Neng Liao, New Taipei (TW); Cheng-Wen Hsieh, New Taipei (TW); Yu-Ming Lin, New Taipei (TW); Wei-Chin Chen, New Taipei (TW); Kuang-Hua Lin, New Taipei (TW); Sheng-Yan Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 18/322,540

(22) Filed: May 23, 2023

(65) Prior Publication Data

US 2023/0301017 A1    Sep. 21, 2023

Related U.S. Application Data

(62) Division of application No. 17/216,684, filed on Mar. 30, 2021, now abandoned.

(30) Foreign Application Priority Data

Apr. 10, 2020   (TW) ................................ 109112202

(51) Int. Cl.
    *H05K 7/20*        (2006.01)
(52) U.S. Cl.
    CPC ..... *H05K 7/20172* (2013.01); *H05K 7/20145* (2013.01); *H05K 7/20154* (2013.01)

(58) Field of Classification Search
CPC .. F04D 29/4226; F04D 17/16; F04D 25/0613; F04D 29/4246; F04D 29/281; F04D 29/4213; F04D 29/422; F04D 29/162; F04D 29/282; F04D 29/30; G06F 1/203; G06F 1/20; G06F 1/206; G06F 1/16; H05K 7/20172; H05K 7/20154; H05K 7/20145; H05K 7/20136; H05K 7/20972; H01L 23/467
USPC ......................................................... 361/695
See application file for complete search history.

(56) References Cited

U.S. PATENT DOCUMENTS

| 9,399,999 | B2 * | 7/2016 | Horng ..................... F28G 1/16 |
| 10,584,717 | B1 | 3/2020 | He et al. |
| 11,215,193 | B2 * | 1/2022 | Berberoglu ........... F04D 29/422 |
| 2011/0110774 | A1 * | 5/2011 | Horng ................ H05K 7/20172 |
| | | | 415/208.1 |

(Continued)

FOREIGN PATENT DOCUMENTS

| CN | 101187384 | 5/2008 |
| CN | 201943968 | 8/2011 |

(Continued)

*Primary Examiner* — Mandeep S Buttar
(74) *Attorney, Agent, or Firm* — JCIPRNET

(57) ABSTRACT

A centrifugal heat dissipation fan including a housing and an impeller is provided. The housing has at least one inlet disposed along an axis and at least one first outlet and a second outlet located in different radial directions, wherein the first outlet and the second outlet are opposite to and separated from each other. The impeller is disposed in the housing along the axis. A heat dissipation system of an electronic device is also provided.

23 Claims, 16 Drawing Sheets

(56) References Cited

U.S. PATENT DOCUMENTS

| | | | |
|---|---|---|---|
| 2014/0314558 A1* | 10/2014 | Tsai | F04D 29/422 |
| | | | 415/206 |
| 2016/0146216 A1* | 5/2016 | Chang | F04D 29/4226 |
| | | | 415/203 |
| 2018/0298914 A1* | 10/2018 | Nakamura | B60H 1/00471 |
| 2020/0340493 A1* | 10/2020 | He | G06F 1/203 |
| 2020/0352051 A1* | 11/2020 | He | F04D 29/4246 |
| 2021/0079926 A1* | 3/2021 | He | F04D 29/4246 |
| 2021/0317844 A1* | 10/2021 | Chen | F04D 29/281 |
| 2021/0321533 A1* | 10/2021 | Chen | F04D 29/281 |

FOREIGN PATENT DOCUMENTS

| | | |
|---|---|---|
| CN | 102996516 | 3/2013 |
| TW | 201934884 | 9/2019 |

* cited by examiner

CENTRIFUGAL HEAT DISSIPATION FAN AND HEAT DISSIPATION SYSTEM OF ELECTRONIC DEVICE

CROSS-REFERENCE TO RELATED APPLICATION

This application is a divisional application of and claims the priority benefit of U.S. application Ser. No. 17/216,684, filed on Mar. 30, 2021, which claims the priority benefit of Taiwan application serial no. 109112202, filed on Apr. 10, 2020. The entirety of each of the above-mentioned patent applications is hereby incorporated by reference herein and made a part of this specification.

BACKGROUND

Technical Field

The disclosure relates to a heat dissipation fan and a heat dissipation system, and in particular to a centrifugal heat dissipation fan and a heat dissipation system of an electronic device.

Description of Related Art

Generally speaking, in order to improve the heat dissipation effect in a notebook computer, the heat resistance of the system may be reduced or the performance of the internal heat dissipation fan may be improved. However, since notebook computers are trending toward lighter and thinner appearances without too many heat dissipation holes, the heat resistance of the system is relatively high, thereby reducing the air intake of the heat dissipation fan, so that air from the external environment does not readily enter the system to generate the heat convection required for heat dissipation.

At the same time, the air gap between the blades of the conventional centrifugal fan is relatively large, so the air flow may not be easily controlled and backflow may readily occur, so that the wind pressure is insufficient, thereby affecting the heat dissipation efficiency. Moreover, when the inlet is enlarged to increase the air intake, if the fan blades do not provide a corresponding structure, situations such as air leakage may readily occur.

In addition, since electronic devices (such as notebook computer or tablet computer) are gradually trending toward lighter and thinner designs, in the case of extremely limited internal space, the heat dissipation fan installed therein is also required to be thinner as the goal. As a result, under the condition of limited space, the air flow of the heat dissipation fan cannot smoothly enter and exit the heat dissipation fan, thereby affecting the heat dissipation efficiency thereof.

Based on the above, in the case where the heat resistance of the conventional system is present, the above issue can be effectively solved by providing effective means for increasing the wind pressure and air volume of the heat dissipation fan.

SUMMARY

The disclosure provides a centrifugal heat dissipation fan and a heat dissipation system of an electronic device, wherein the centrifugal heat dissipation fan has two outlets located in different radial directions and opposite to each other, so as to satisfy both heat dissipation performance and system configuration.

The centrifugal heat dissipation fan of the disclosure includes a housing and an impeller. The housing has at least one inlet disposed along an axis and at least one first outlet and a second outlet located in different radial directions, wherein the first outlet and the second outlet are opposite to and separated from each other. The impeller is disposed in the housing along the axis.

The heat dissipation system of the electronic device according to the disclosure includes a body, multiple heat sources disposed in the body, and at least one centrifugal heat dissipation fan. The centrifugal heat dissipation fan includes a housing and an impeller. The housing has at least one inlet disposed along an axis and at least one first outlet and a second outlet located in different radial directions, wherein the first outlet and the second outlet are opposite to and separated from each other. The impeller is disposed in the housing along the axis.

Based on the above, since the centrifugal heat dissipation fan is disposed with the first outlet and the second outlet in different radial directions and separated from each other, there will be different corresponding manners for the heat source configuration inside the electronic device. As such, the design concept of the centrifugal heat dissipation fan in the prior art is eradicated, so that the air flow may be first discharged from the first outlet during the process of being driven and compressed via the impeller rotation after being drawn into the housing from the inlet in the axial direction. Also, in terms of the overall centrifugal heat dissipation fan, the external air flow is continuously drawn in from the inlet in the axial direction, so the second outlet can still maintain the required air output. Therefore, in terms of the overall air output of the fan, the total air output for adopting the outlets in different radial directions is significantly better than the single outlet design in the prior art.

To make the aforementioned and other features of the disclosure more comprehensible, several embodiments accompanied with drawings are described in detail as follows.

DETAILED DESCRIPTION OF DISCLOSED EMBODIMENTS

Figure 1A:
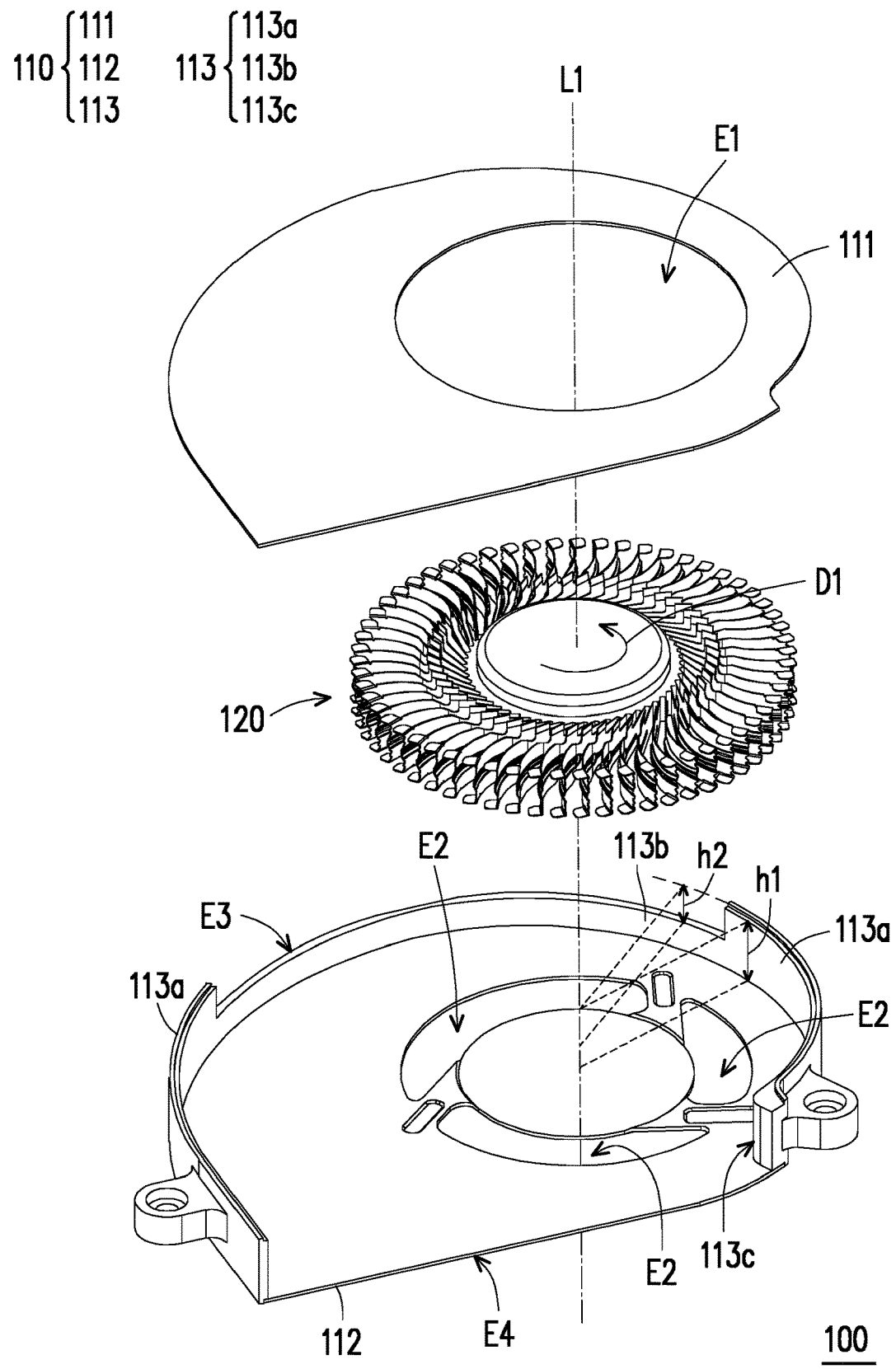
FIG. 1A is an exploded view of a centrifugal heat dissipation fan according to an embodiment of the disclosure.
Figure 1B:
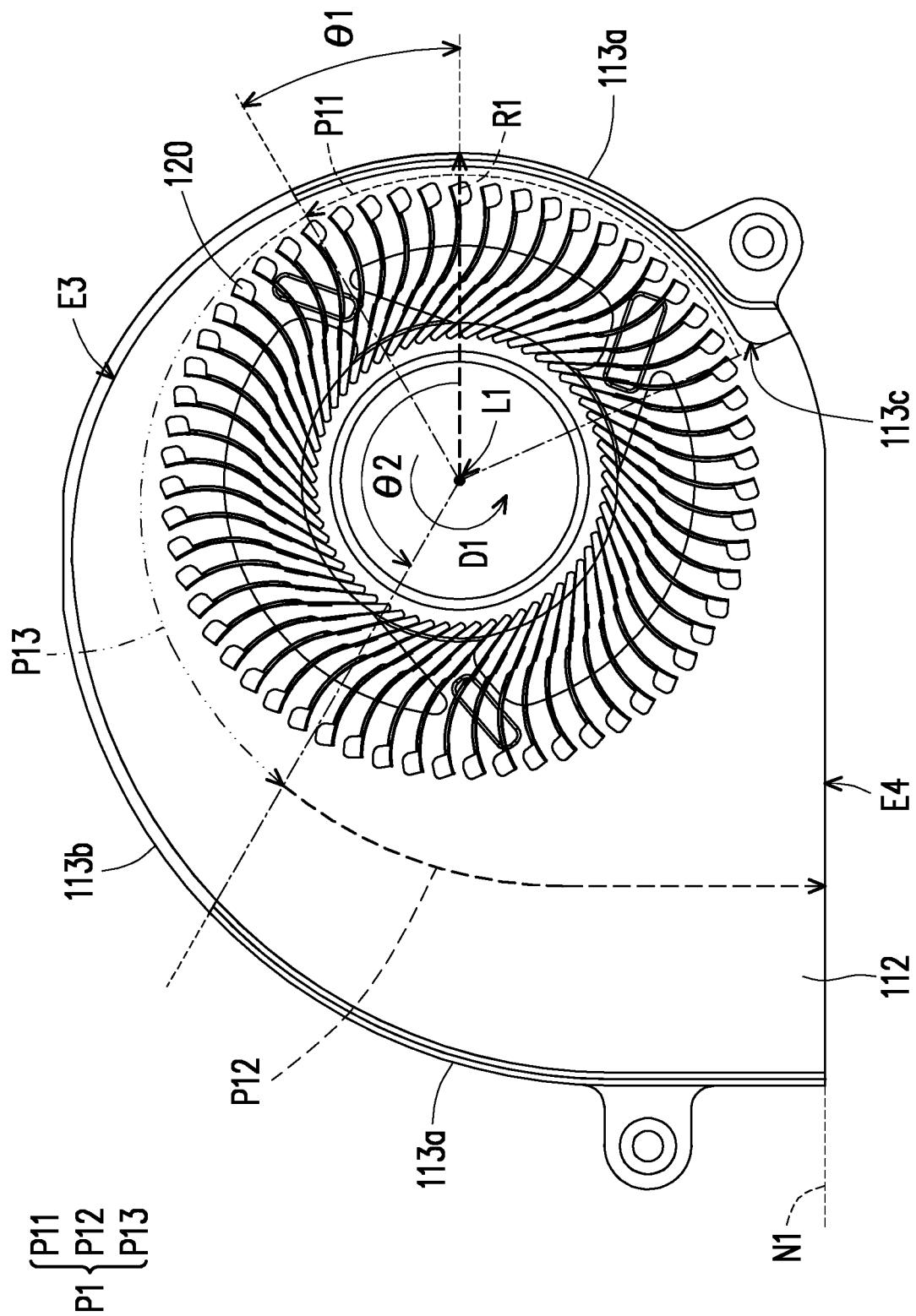
FIG. 1B is a top view of the centrifugal heat dissipation fan of FIG. 1A.

FIG. 1A is an exploded view of a centrifugal heat dissipation fan according to an embodiment of the disclosure. FIG. 1B is a top view of the centrifugal heat dissipation fan of FIG. 1A. Please refer to FIG. 1A and FIG. 1B at the same time. In the embodiment, a centrifugal heat dissipation fan 100 includes a housing 110 and an impeller 120. The housing 110 has at least one inlet (inlets E1 and E2 are exemplified here) disposed along an axis L1 and at least one first outlet (first outlet E3 is exemplified here) and a second outlet E4 located in different radial directions, wherein the first outlet E3 and the second outlet E4 are opposite to and separated from each other. The impeller 120 is disposed in the housing 110 along the axis L1 (that is, the axis L1 is regarded as the rotational axis of the impeller 120). It should be noted that the driving manner (such as driving the impeller 120 to rotate by connecting a motor thereto) of the centrifugal heat dissipation fan 100 can be known from the prior art, which will be omitted without detailed reiteration in the embodiment. When the impeller 120 rotates with the axis L1 in the housing 110, air flow is generated, which enters the housing 110 from the inlets E1 and E2, and flows out of the housing 110 from the first outlet E3 and the second outlet E4 in the axial directions.

Further, the housing 110 includes a base 112, an upper cover 111, and a side wall 113, wherein the base 112 has the inlet E2, the upper cover 111 has the inlet E1, and the side wall 113 is substantially erected between the upper cover 111 and the base 112, so as to form the first outlet E3 and the second outlet E4 after the three are combined. After the impeller 120 is assembled to the housing 110, at least one divergent channel P1 is formed. Here, a tongue end 113c of the housing 110 is the starting point of the divergent channel P1 and the tongue end 113c is adjacent to the second outlet E4. The diverging direction of the divergent channel P1 is the same as a rotational direction D1 of the impeller 120 (both are counterclockwise as shown in FIG. 1B). Since the channel width (the gap between the blade end of the impeller 120 and the side wall 113 of the housing 110) also diverges along with the rotational direction D1, the air output will also increase according to the position in the channel, wherein the first outlet E3 is located in the middle section of the divergent channel P1 and the second outlet E4 is located at the end of the divergent channel P1. Therefore, the air output of the second outlet E4 is greater than the air output of the first outlet E3, that is, in terms of the centrifugal heat dissipation fan 100, the second outlet E4 is regarded as the main outlet and the first outlet E3 is regarded as the auxiliary outlet. In the embodiment, there is a non-90-degree included angle between the air output radial direction of the first outlet E3 and the air output radial direction of the second outlet E4 to ensure that the two are structurally separated from each other, wherein the second outlet E4 is a planar outlet.

The relative position and opening range of the first outlet E3 are further defined below based on the second outlet E4. As shown in FIG. 1B, since the first outlet E3 is disposed along with the divergent channel P1, the first outlet E3 will also have a divergent arc-shaped opening the same as the divergent channel P1, which is different from the planar opening of the second outlet E4. Here, the housing 110 has a reference radial direction R1 opposite to the axis L1 and parallel to a plane N1 where the second outlet E4 is located. Further, based on the reference radial direction R1 (which is regarded as 0 degrees) and in the rotational direction D1 along the impeller 120, the starting point of the first outlet E3 according to the embodiment is located at a position with a central angle θ1 of 30 degrees relative to the reference radial direction R1 and the end point of the first outlet E3 is located at a position with a central angle θ2 of 150 degrees relative to the reference radial direction R1, that is, the radial direction range of the first outlet E3 according to the embodiment has a central angle of 120 degrees relative to the axis L1.

It should also be mentioned that the orthographic projection size of the first outlet E3 according to the embodiment on the axis L1 is smaller than the orthographic projection size of the housing 110 on the axis L1. That is, as shown in FIG. 1A, in the thickness (height) direction parallel to the axis L1, the first outlet E3 has a size h2, which is less than a size h1 of the side wall 113. In other words, the first outlet E3 according to the embodiment belongs to a semi-open structure, which is equivalent to a structure 113a and a structure 113b of the side wall 113 having different thicknesses, wherein the first outlet E3 is located at the structure 113b to control the wind direction of the centrifugal heat dissipation fan 100, which is especially suitable for the heat dissipation system in a layered configuration, that is, the positions of the heat source and other structures belong to different layers in the thickness direction along the axis L1. Therefore, the first outlet E3 according to the embodiment can provide the required heat dissipation performance with respect to where the heat source is located.

Furthermore, since the first outlet E3 belongs to a semi-open structure, the divergent channel P1 according to the embodiment is divided into a first channel P11, a second channel P12, and a third channel P13. The third channel P13 is connected between the first channel P11 and the second channel P12. Also, according to the diverging feature, the channel widths diverge in sequence from the first channel P11, the third channel P13, and the second channel P12. The tongue end 113c is regarded as the starting point of the first channel P11, and the paths of the third channel P13 and the first outlet E3 are overlapped with each other, thereby forming a cyclically and adjacently connected structure of the first channel P11, the first outlet E3 (third channel P13), the second channel P12, and the second outlet E4, so that when the air flow is output from the first outlet E3, a portion of the air flow may continue to be compressed by the impeller 120 along the third channel P13, transmitted to the second channel P12 to continue compression, and finally output from the second outlet E4.

Figure 2A:
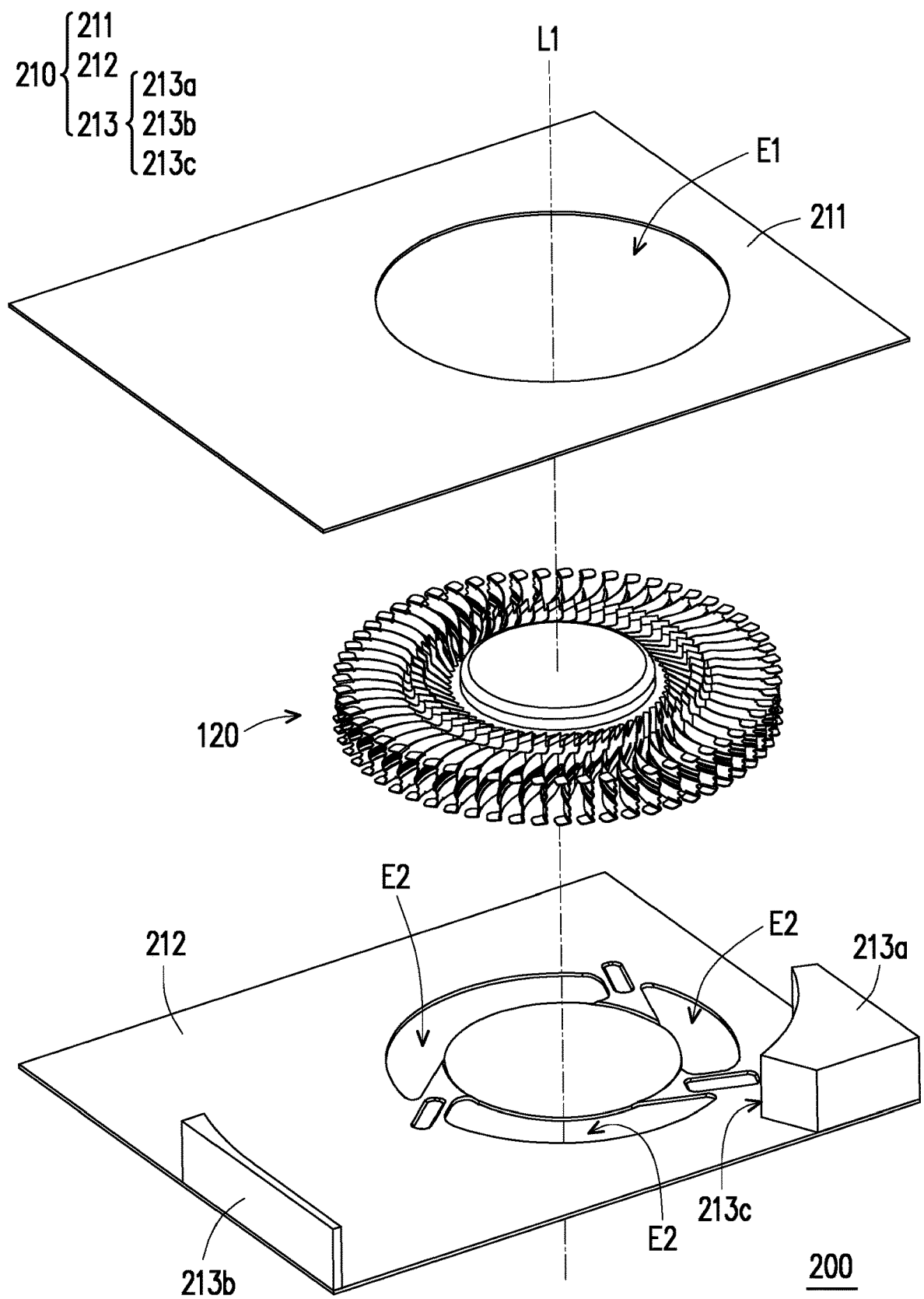
FIG. 2A is an exploded view of a centrifugal heat dissipation fan according to another embodiment of the disclosure.
Figure 2B:
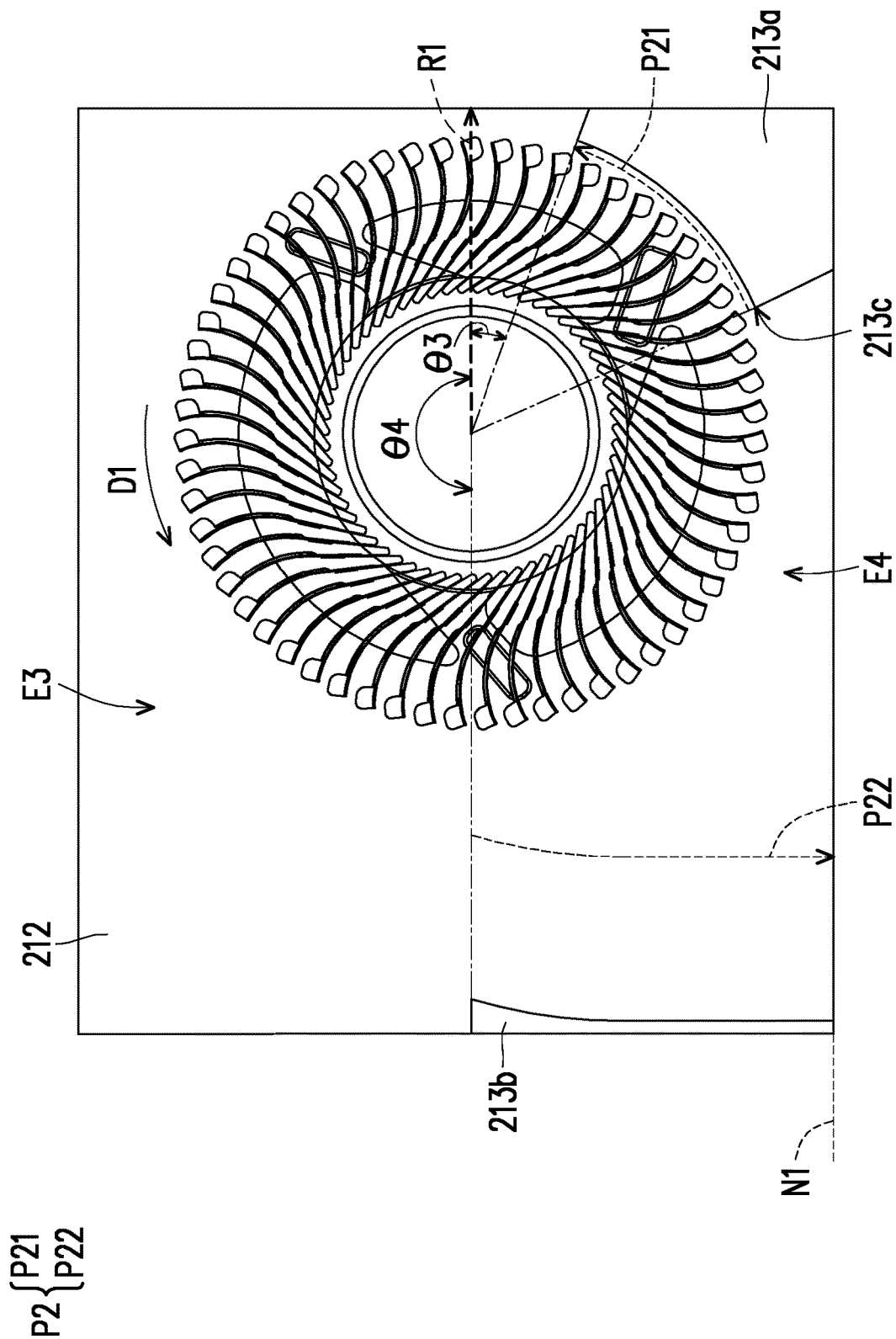
FIG. 2B is a top view of the centrifugal heat dissipation fan of FIG. 2A.

FIG. 2A is an exploded view of a centrifugal heat dissipation fan according to another embodiment of the disclosure. FIG. 2B is a top view of the centrifugal heat dissipation fan of FIG. 2A. Please refer to FIG. 2A and FIG. 2B at the same time, wherein the same components as the previous embodiment are shown by the same reference numerals and will not be reiterated in detail. In the embodiment, a centrifugal heat dissipation fan 200 includes a housing 210 and an impeller 120, wherein the housing 210 includes an upper cover 211, a base 212, and a side wall 213 erected between the two. The difference from the foregoing embodiment is that the side wall 213 includes a structure 213a and a structure 213b opposite to each other, wherein the structure 213a has a tongue end 213c, so that the impeller 120 and the housing 210 form a divergent channel P2, and a first outlet E3 and a second outlet E4 opposite to each other, wherein the divergent channel P2 includes a first channel P21 and a second channel P22 maintaining the diverging feature, that is, the channel width of the first channel P21 is less than the channel width of the second channel P22.

In addition, the housing 210 also has a reference radial direction R1 parallel to a plane N1 where the second outlet E4 is located as the basis, but the difference is that the starting point of the first outlet E3 is located at a position with a central angle θ3 of −20 degrees relative to the reference radial direction R1 and the end point of the first outlet E3 is located at a position with a central angle θ4 of 180 degrees relative to the reference radial R1, that is, the radial direction range of the first outlet E3 has a central angle of 200 degrees relative to the axis L1.

Figure 3:
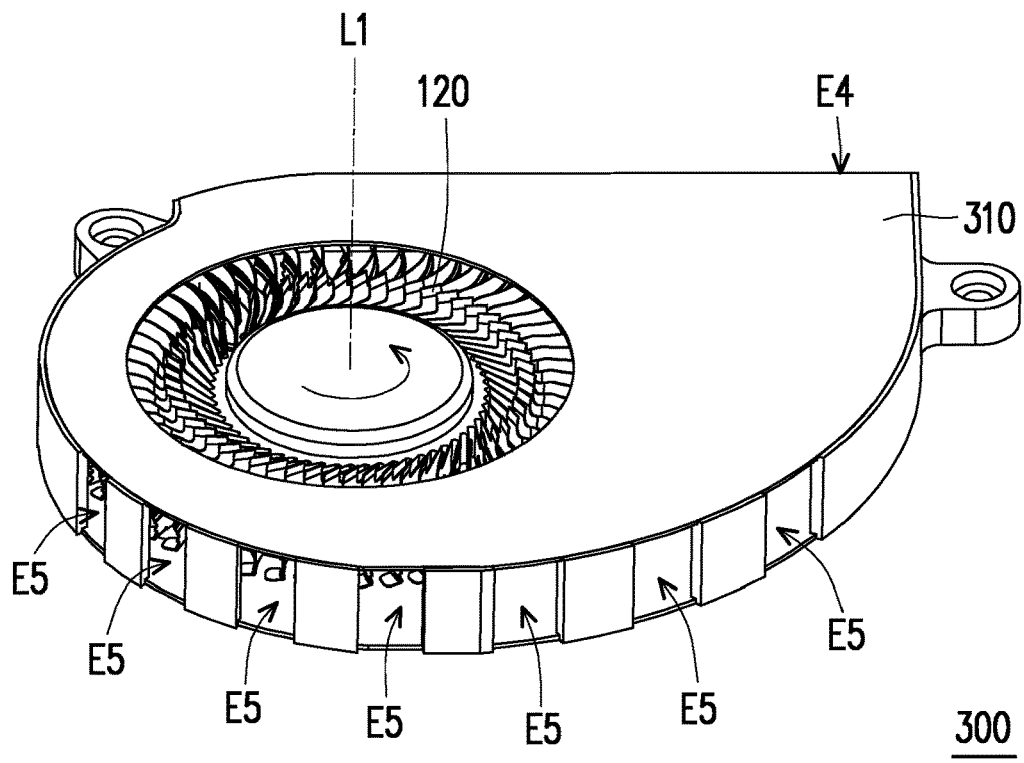
FIG. 3 to FIG. 5 are schematic views of centrifugal heat dissipation fans according to different embodiments of the disclosure.
Figure 4:
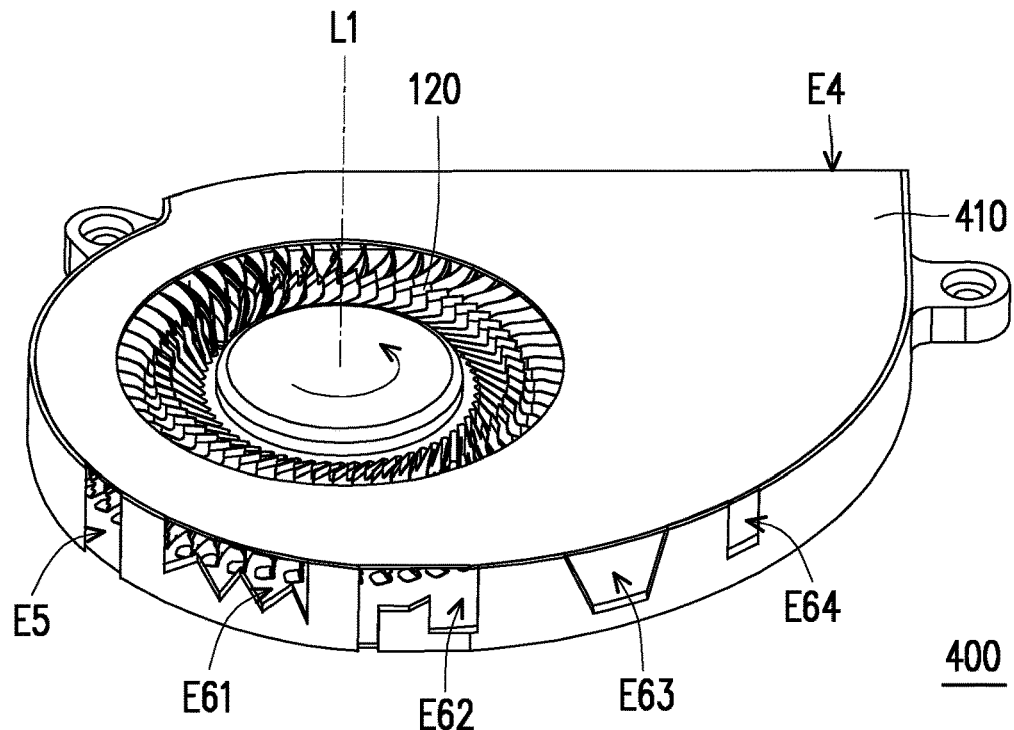
Figure 5:
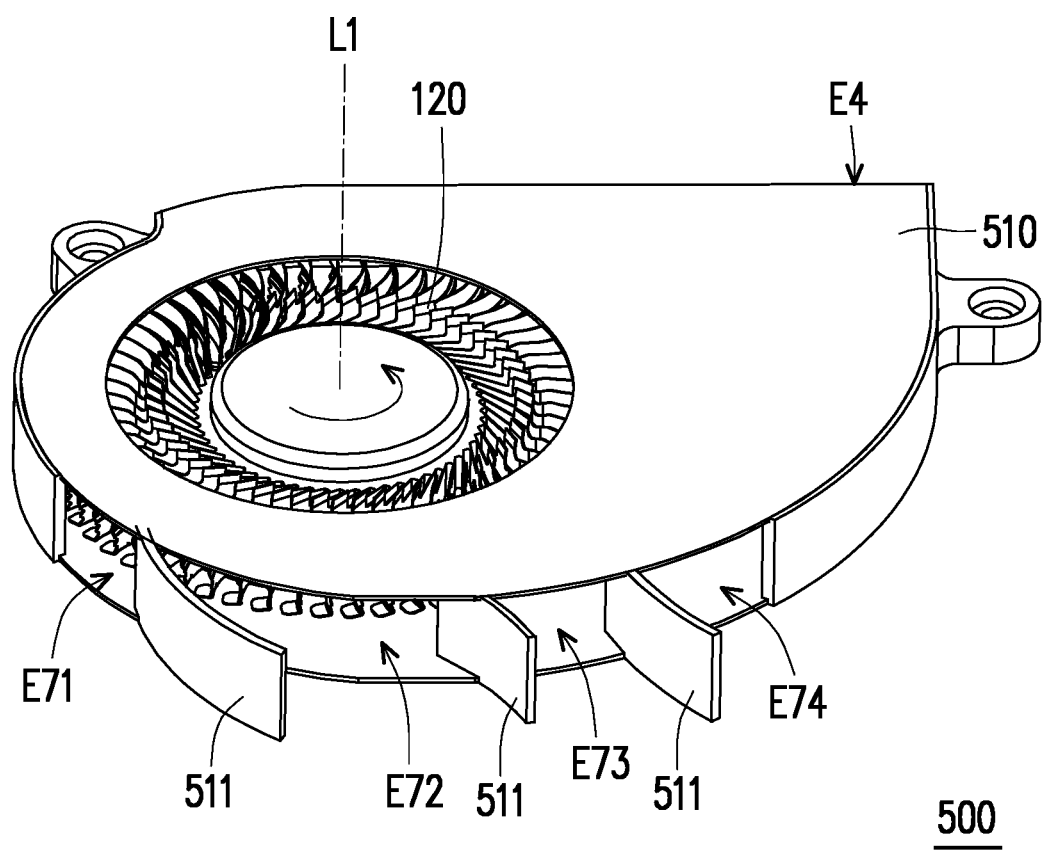

FIG. 3 to FIG. 5 are schematic views of centrifugal heat dissipation fans according to different embodiments of the disclosure. Please refer to FIG. 3 first. A housing 310 of a centrifugal heat dissipation fan 300 as shown has multiple first outlets E5, which are distributed along a divergent channel and are located in different radial directions. Here, the spacing between adjacent first outlets E5 is not limited, which may be appropriately adjusted according to the requirements of the heat dissipation system. Please refer to FIG. 4. A housing 410 of a centrifugal heat dissipation fan 400 as shown has multiple first outlets E5 and E61 to E64, wherein the first outlet E5 is as shown in FIG. 3 and the first outlets E61 to E64 are respectively presented with different opening contours. Here, the opening contours of the first outlets E5 and E61 to E64 are not limited, which may be appropriately adjusted according to the requirements of the heat dissipation system.

Please refer to FIG. 5. A housing 510 of a centrifugal heat dissipation fan 500 as shown has multiple guiding structures 511 adjacent to first outlets E71 to E74 in addition to the first outlets E71 to E74 distributed along a divergent channel and located in different radial directions. Each guiding structure 511 extends from the first outlets E71 to E74 away from the impeller 120, that is, extends away from an axis L1.

FIG. 6A to FIG. 6D are top views of heat dissipation systems of electronic devices according to different embodiments of the disclosure. It should be stated first that the following heat dissipation systems may all adopt the centrifugal heat dissipation fans 100 to 500 of the different embodiments above according to requirements. Please refer to FIG. 6A first. The heat dissipation system of the electronic device shown includes a body 20, multiple heat sources 21 and 22, a heat conduction element 24, a heat dissipation fin 23, and a centrifugal heat dissipation fan 600, wherein the heat sources 21 and 22 include electronic chips, such as central processing and display chips, which respectively transmit the heat generated to the heat dissipation fin 23 by the heat conduction element 24. In the embodiment, a first outlet E3 of the centrifugal heat dissipation fan 600 corresponds to the heat sources 21 and 22, and a second outlet E4 corresponds to the heat dissipation fin 23. Therefore, in the heat dissipation system, the centrifugal heat dissipation fan 600 still mainly uses the second outlet E4 to dissipate heat from the heat dissipation fin 23. However, since the first outlet E3 may also directly dissipate heat from the heat sources 21 and 22, the heat transmitted from the heat sources 21 and 22 to the heat dissipation fin 23 is expected to be reduced, thereby reducing the heat dissipation burden of the centrifugal heat dissipation fan 600 at the second outlet E4. Therefore, the embodiment achieves the effect of dispersing the heat dissipation burden by enabling the centrifugal heat dissipation fan 600 to have the first outlet E3 and the second outlet E4 in different radial directions, thereby improving the overall heat dissipation efficiency.

Here, the heat conduction element 24 is exemplified by a heat pipe, but in other embodiments not shown, the heat conduction element 24 may also be a vapor chamber.

Figure 6A:
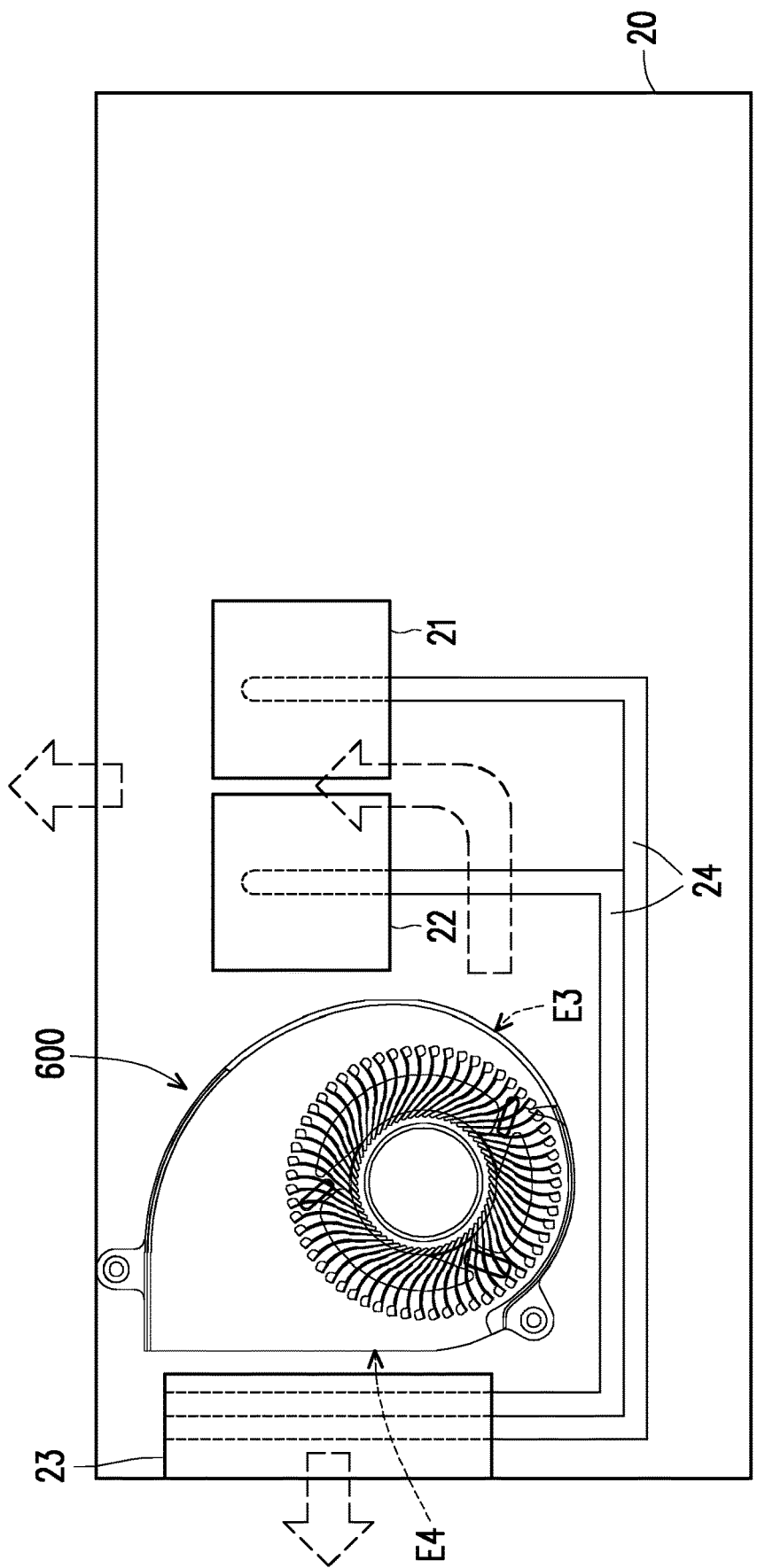
FIG. 6A to FIG. 6D are top views of heat dissipation systems of electronic devices according to different embodiments of the disclosure.
Figure 6B:
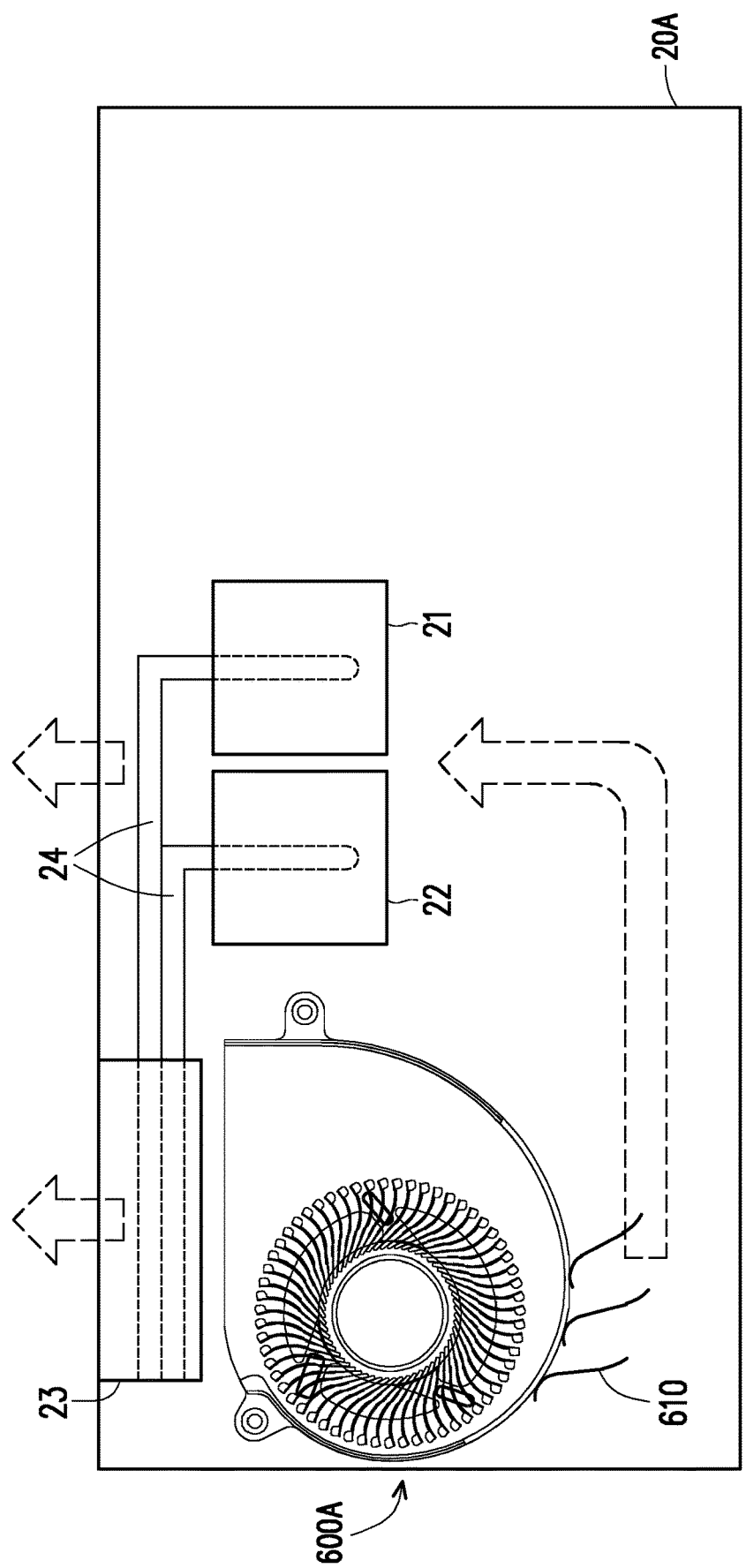

Please refer to FIG. 6B, the difference from the previous embodiment is that a centrifugal heat dissipation fan 600A according to the present embodiment is, for example, as shown in FIG. to have a guiding structure 610 located at an outlet, so as to correspondingly guide the air flow output toward the heat sources 21 and 22, and finally discharge the heat dissipation air flow from the same side of a body 20A.

Figure 6C:
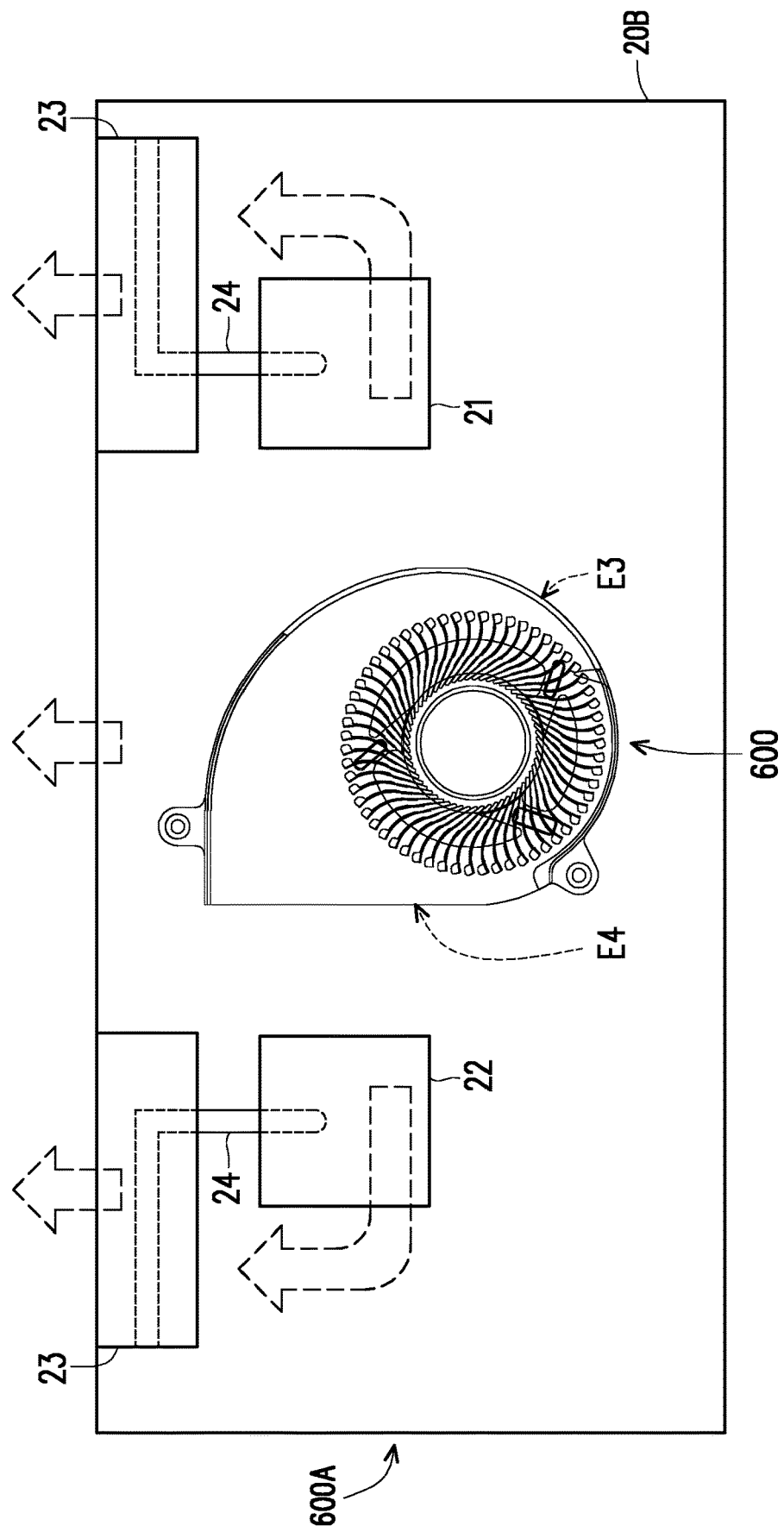
Figure 6D:
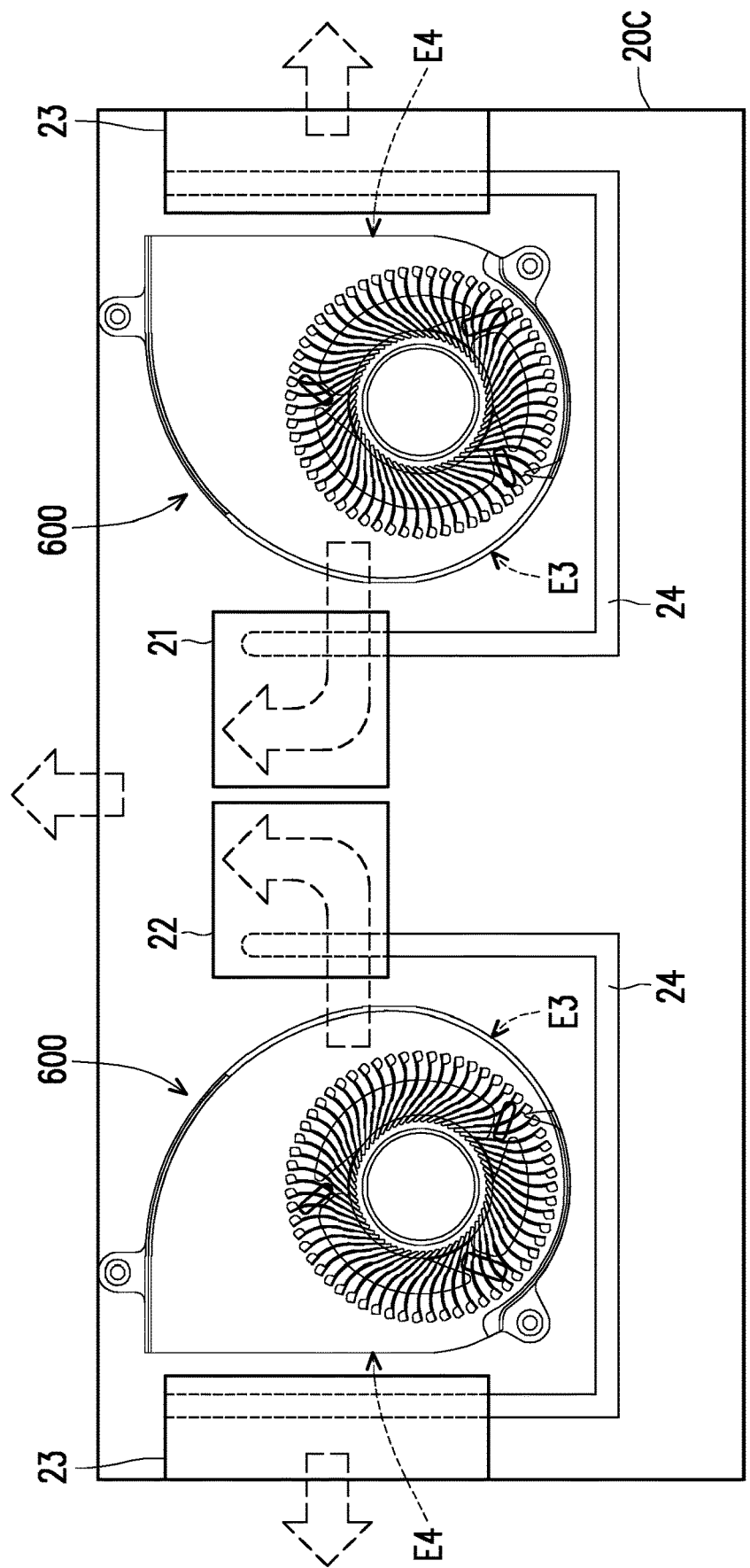

Please refer to FIG. 6C. Another configuration is adopted in a body 20B according to the embodiment, that is, a first outlet E3 and a second outlet E4 of a centrifugal heat dissipation fan 600 each corresponds to a heat source 21 or 22 and each corresponds to a heat dissipation fin 23. Please refer to FIG. 6D. The heat dissipation system as shown further uses a pair of centrifugal heat dissipation fans 600, so that each corresponds to a heat source and each corresponds to a heat dissipation fin 23, wherein the heat sources 21 and 22 may simultaneously withstand the air flow output from the first outlet E3 of different centrifugal heat dissipation fans 600 to be output from a body 20C after the heat dissipation converge.

Based on FIG. 6A to FIG. 6D, the heat dissipation system of the electronic device may correspond to different configurations of the heat sources 21 and 22 by the presence of the first outlet E3 and the second outlet E4 of the centrifugal heat dissipation fan 600, thereby improving the application scope of the heat dissipation system of the electronic device.

Figure 7A:
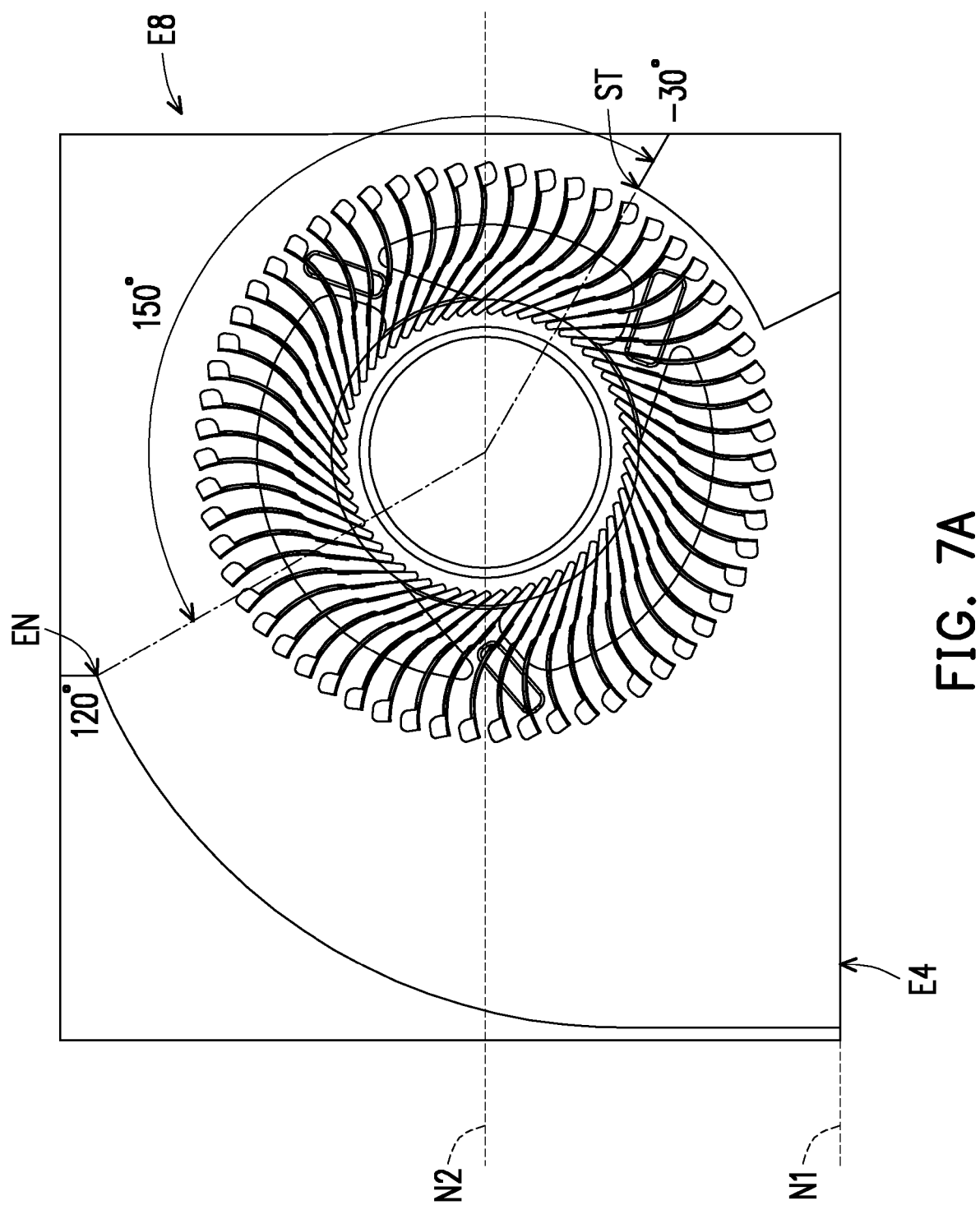
FIG. 7A to FIG. 7F illustrate different ranges of a first outlet.
Figure 7B:
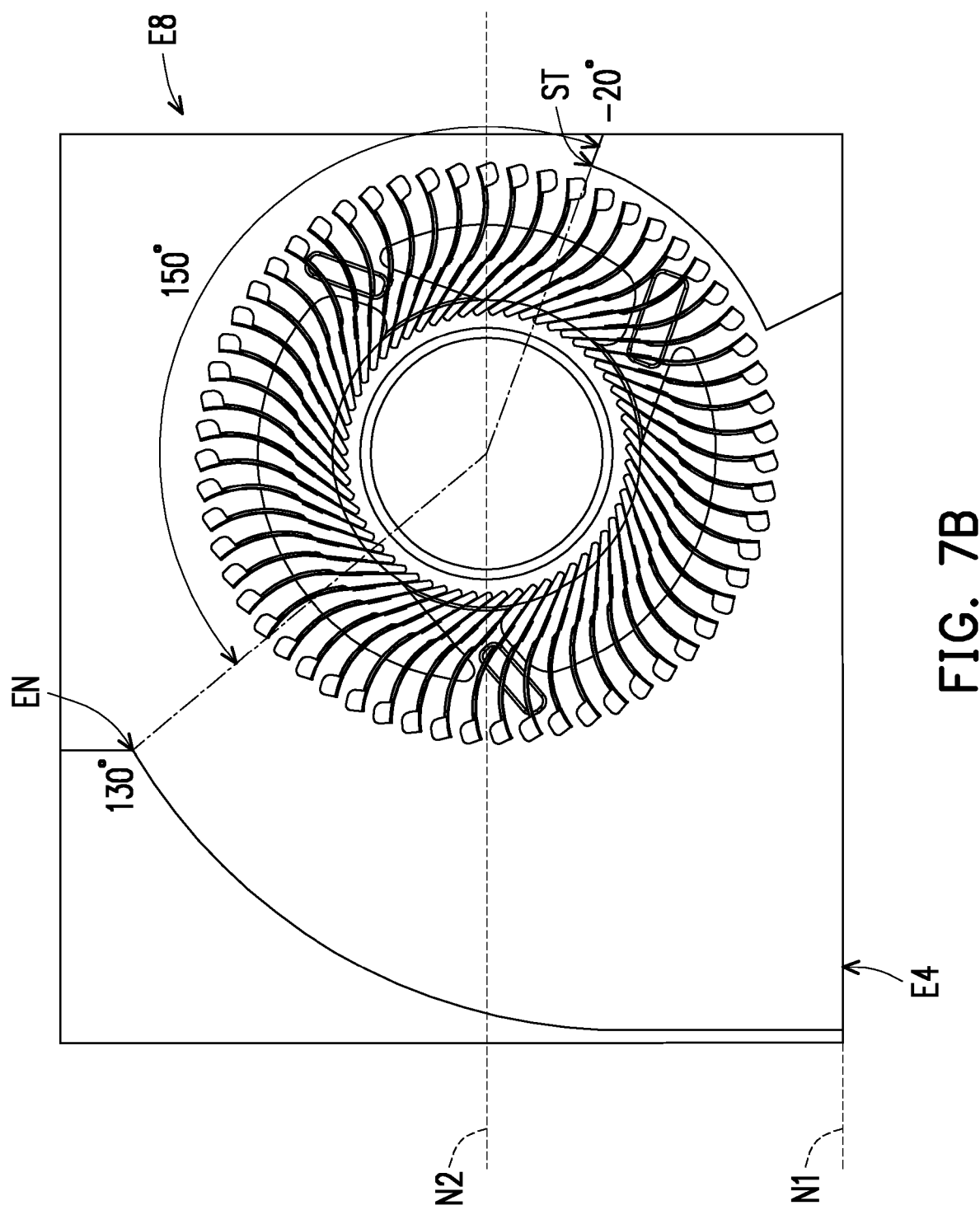
Figure 7C:
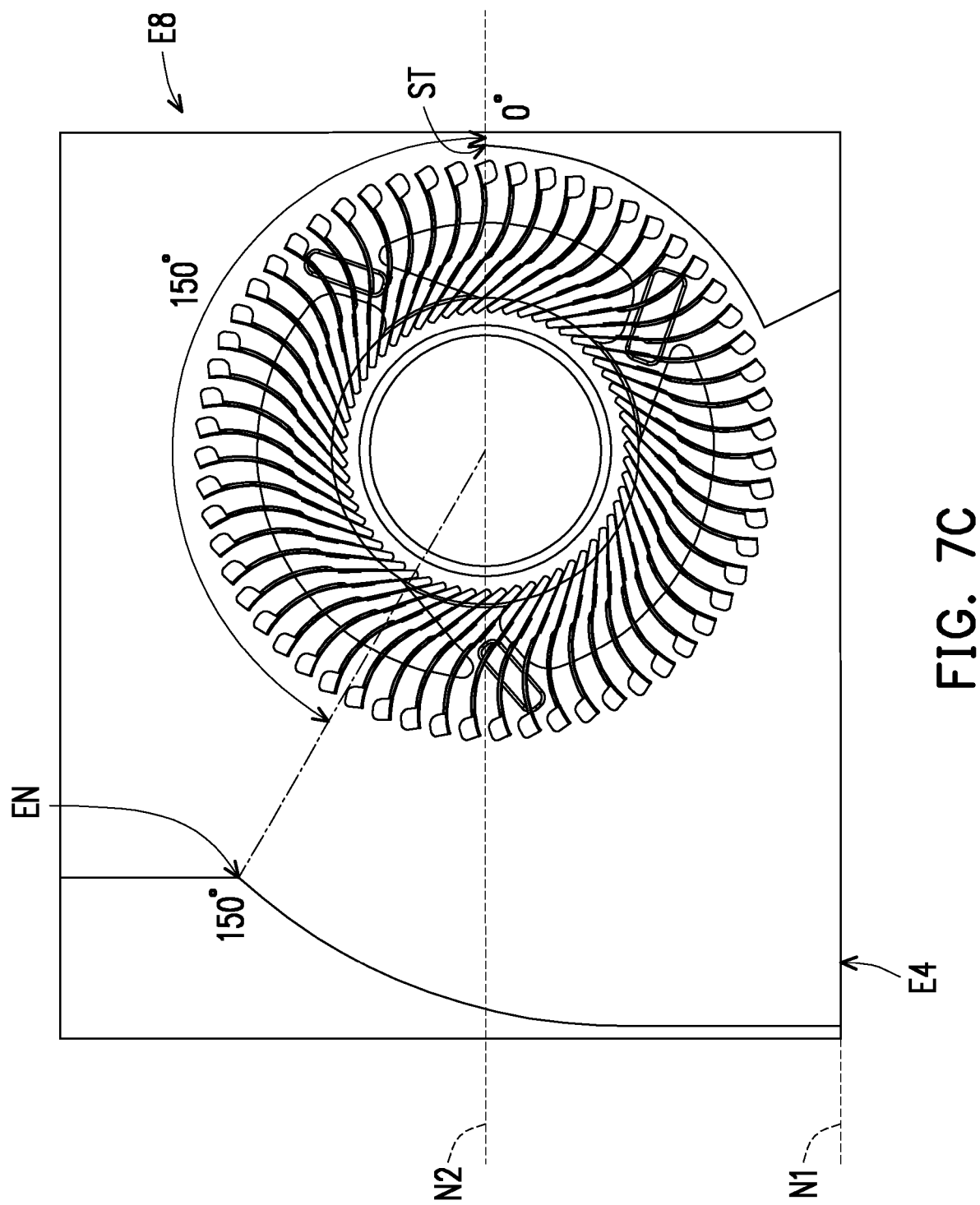
Figure 7D:
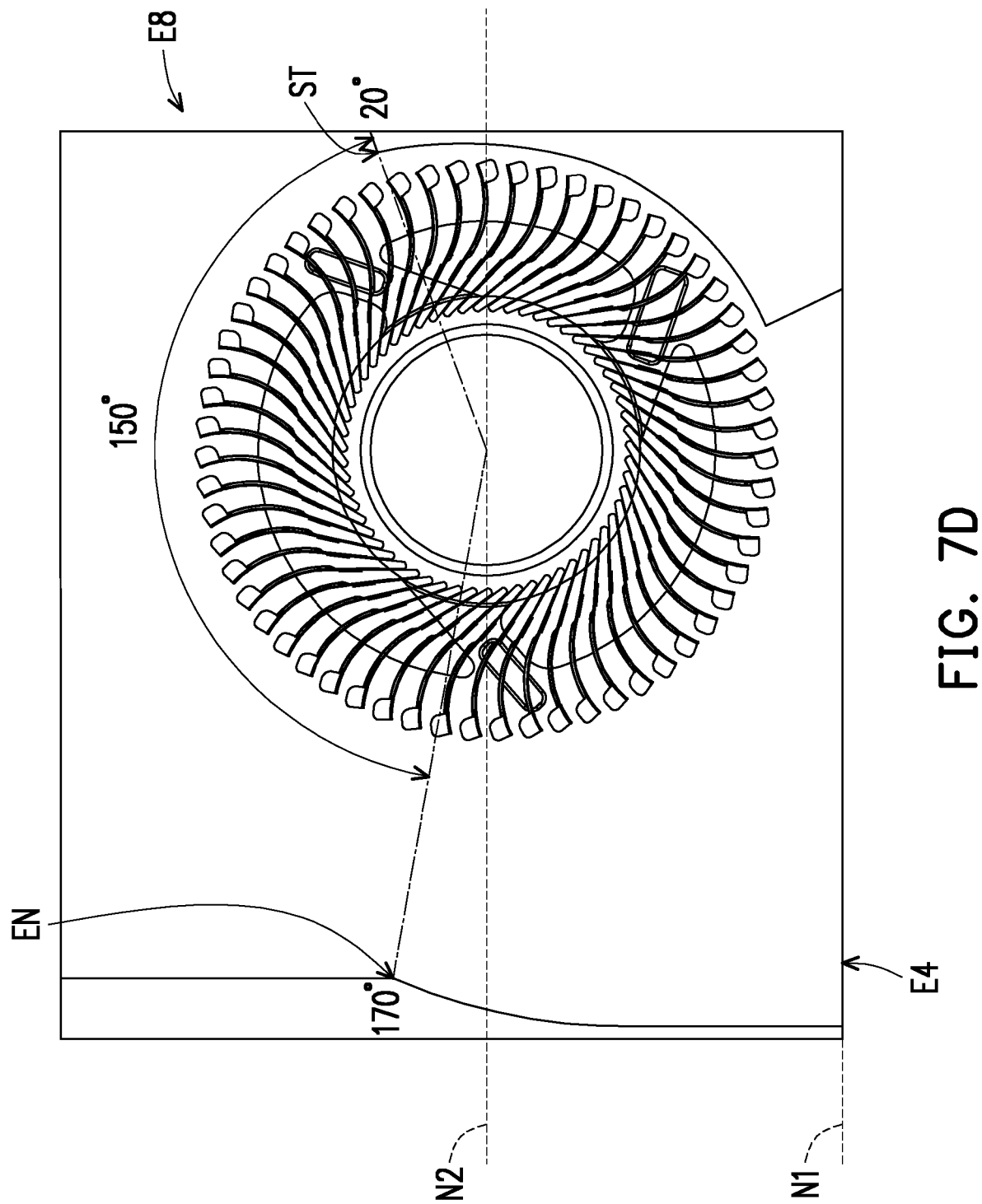
Figure 7E:
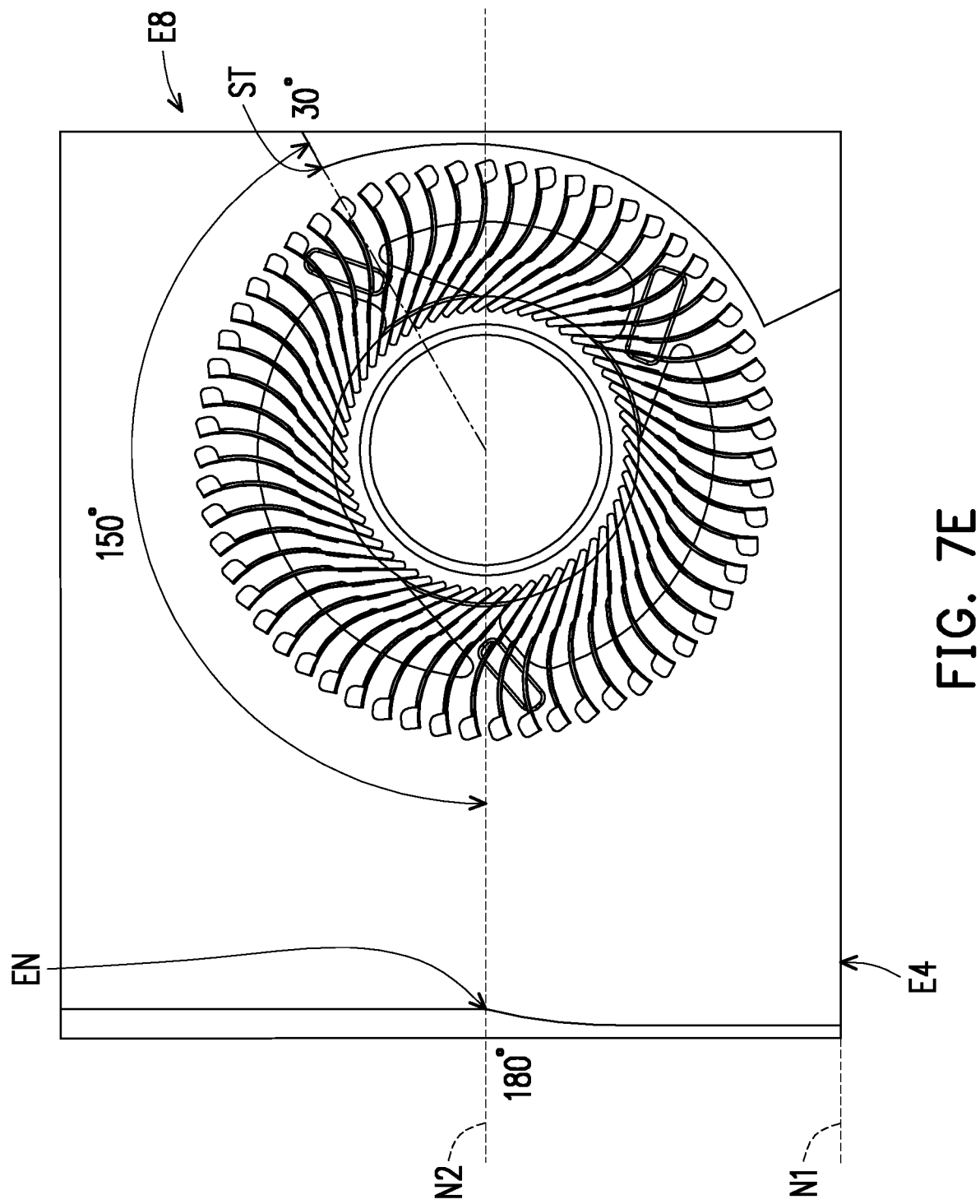
Figure 7F:
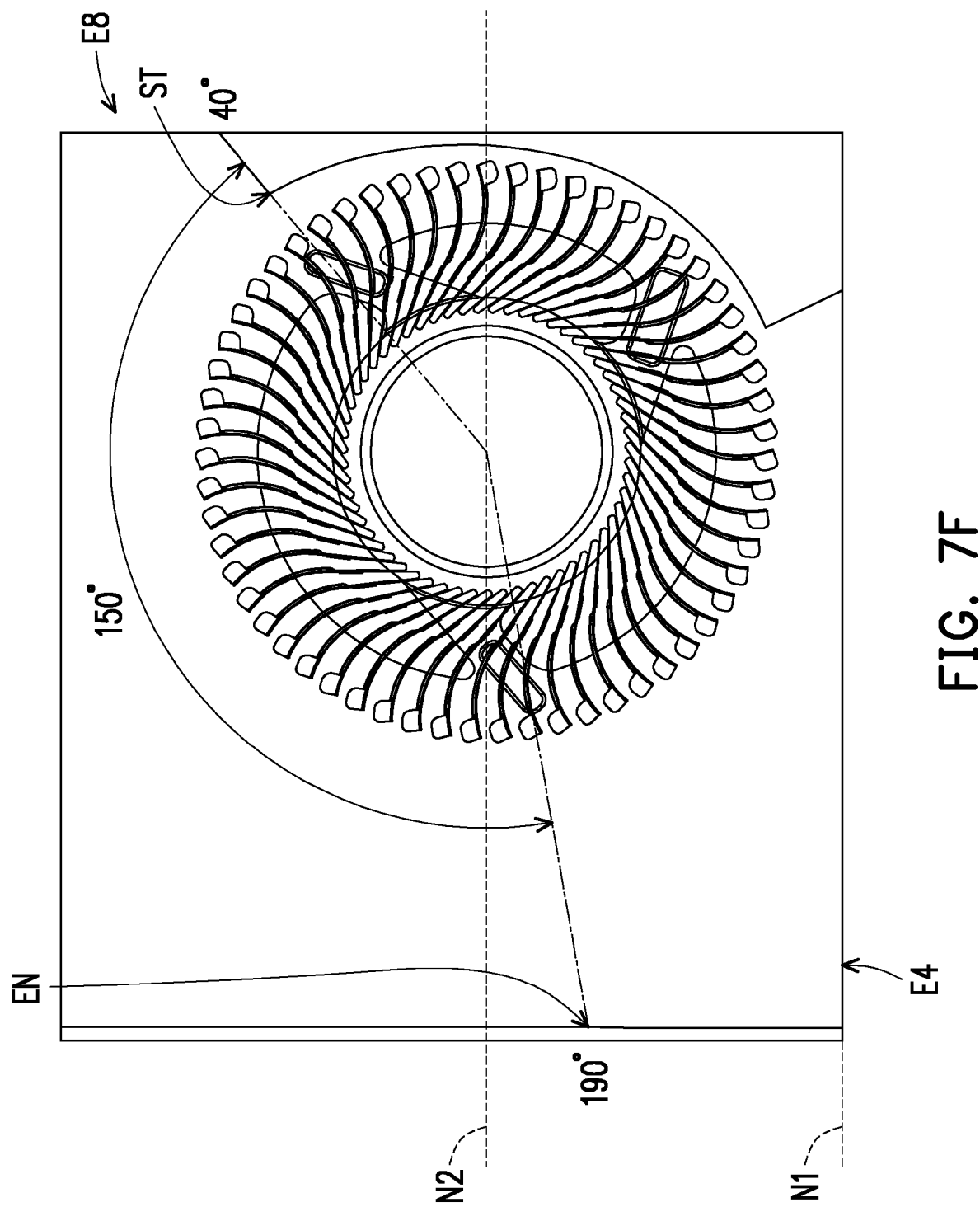

FIG. 7A to FIG. 7F illustrate different ranges of a first outlet. Relevant data shown in the following table is obtained by detecting the air output of the first outlet, wherein the rotational speed of the impeller 120 is 4000 rpm and the unit of air volume is cubic feet per minute (CFM):

| | Corresponding FIG. | | | | | |
|---|---|---|---|---|---|---|
| | FIG. 7A | FIG. 7B | FIG. 7C | FIG. 7D | FIG. 7E | FIG. 7F |
| Air output of first outlet (CFM) | 5.70 | 6.17 | 6.69 | 7.24 | 7.52 | 7.78 |
| Air output of second outlet (CFM) | 9.10 | 9.07 | 8.56 | 8.02 | 7.75 | 7.51 |
| Total air output (CFM) | 14.80 | 15.24 | 15.25 | 15.26 | 15.27 | 15.29 |

It can be clearly known from the above table that under the premise that the range of a first outlet E8 is at a central angle of 150 degrees, changes in a starting point ST and an end point EN thereof will also cause changes in the corresponding air output of a first outlet E8 and a second outlet E4. A plane N2 that has passed an axis L1 of an impeller 120 is taken as the basis, wherein the plane N2 is parallel to a plane N1 where the second outlet E4 is located. When the starting point ST is less than −20 degrees (ST is located at a position of −30 degrees as shown in FIG. 7A), the total air output is relatively small. When the central angle of the position of the end point EN gradually increases, the air output of the first outlet E8 also increases accordingly until the air output of the first outlet E8 is greater than the air output of the second outlet E4 shown in FIG. 7F. Based on the above, the range of the first outlet E8 according to the embodiment is limited to the range as shown in FIG. 7B to FIG. 7E, such that the position of the starting point ST needs to be greater than a central angle of −20 degrees and the position of the end point EN needs to be less than a central angle of 180 degrees to ensure that the air output of the first outlet E8 is less than the air output of the second outlet E4 under the premise that the total air output is increased.

In summary, in the above embodiments of the disclosure, since the centrifugal heat dissipation fan is disposed with the first outlet and the second outlet in different radial directions and separated from each other, there will be different corresponding manners for the heat source configuration inside the electronic device. As such, the design concept of the centrifugal heat dissipation fan in the prior art is eradicated, so that the air flow may be first discharged from the first outlet during the process of being driven and compressed via the impeller rotation after being drawn into the housing from the inlet in the axial direction. Also, in terms of the overall centrifugal heat dissipation fan, the external air flow is continuously drawn in from the inlet in the axial direction, so the second outlet can still maintain the required air output. Therefore, in terms of the overall air output of the fan, the total air output for adopting the outlets in different radial directions is significantly better than the single outlet design in the prior art.

Furthermore, in terms of the centrifugal heat dissipation fan, due to the design of the divergent channel, the second outlet still maintains a relatively large air output and is used as the main heat dissipation air flow outlet without the air output thereof being reduced due to the presence of the first outlet. Therefore, for the overall centrifugal heat dissipation fan, the presence of the first outlet may be used as an additional heat dissipation air flow outlet in addition to maintaining the original overall air output, so as to increase the usage modes of the centrifugal heat dissipation fan.

In addition, the heat dissipation system of the electronic device can provide corresponding heat dissipation solution according to the required internal heat source configuration by having the centrifugal heat dissipation fan disposed with the first outlet and the second outlet in different radial directions, so as to optimize the heat dissipation system of the electronic device and improve the application scope thereof.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A centrifugal heat dissipation fan, comprising:
a housing, having at least one inlet disposed along an axis and at least one first outlet and a second outlet located in different radial directions, wherein the first outlet and the second outlet are opposite to and separated from each other; and
an impeller, disposed in the housing along the axis, wherein a radial direction range of the first outlet relative to the axis has a central angle greater than 180 degree, and a radial direction range of the second outlet relative to the axis has a central angle less than 180 degree.

2. The centrifugal heat dissipation fan according to claim 1, wherein the radial direction range of the first outlet has a central angle of 200 degrees.

3. The centrifugal heat dissipation fan according to claim 1, wherein the housing has a reference radial direction relative to the axis and parallel to a plane where the second outlet is located, and based on the reference radial direction and along a rotational direction of the impeller, a starting point of the first outlet is located at a position with a central angle of −20 degrees relative to the reference radial direction and an end point of the first outlet is located at a position with a central angle of 180 degrees relative to the reference radial direction.

4. The centrifugal heat dissipation fan according to claim 1, wherein the housing has a side wall separating into two structures, two opposite sides of one of the two structures form a start point of the first outlet and an end point of the second outlet respectively, and another two opposite sides of the other one of the two structures form an end point of the first outlet and a start point of the second outlet.

5. The centrifugal heat dissipation fan according to claim 1, wherein the housing has a side wall separating into two structures, one of the two structures is closer to the impeller than the other, and a side of the closer one structure has an tongue end,
wherein the impeller and the housing form at least one divergent channel, the tongue end is a start point of the divergent channel and adjacent to the second outlet, and a diverging direction of the divergent channel is the same as a rotational direction of the impeller.

6. The centrifugal heat dissipation fan according to claim 1, wherein an air output of the second outlet is greater than an air output of the first outlet.

7. The centrifugal heat dissipation fan according to claim 1, wherein the second outlet is a planar outlet.

8. The centrifugal heat dissipation fan according to claim 1, wherein the first outlets are respectively presented with different opening contours.

9. The centrifugal heat dissipation fan according to claim 1, wherein the first outlets are respectively presented with different arc lengths.

10. The centrifugal heat dissipation fan according to claim 1, wherein the housing further has at least one guiding structure, located at the first outlet and extending away from the axis.

11. The centrifugal heat dissipation fan according to claim 1, wherein the second outlet is a planar outlet.

12. A heat dissipation system of an electronic device, comprising: a body; a plurality of heat sources, disposed in the body; and at least one centrifugal heat dissipation fan, disposed in the body, the centrifugal heat dissipation fan comprising: a housing, having at least one inlet disposed along an axis and at least one first outlet and a second outlet located in different radial directions, wherein the first outlet and the second outlet are opposite to and separated from each other, and the first outlet and the second outlet respectively correspond to the plurality of heat sources; and an impeller, disposed in the housing along the axis, wherein a radial direction range of the first outlet relative to the axis has a central angle greater than 180 degree, and a radial direction range of the second outlet relative to the axis has a central angle less than 180 degree.

13. The heat dissipation system of an electronic device according to claim 12, the plurality of heat sources comprises at least one electronic chip, the heat dissipation system of the electronic device further comprises a heat conduction element and a heat dissipation fin, the electronic chip conducts heat to the heat dissipation fin via the heat conduction element, the first outlet corresponds to the electronic chip, and the second outlet corresponds to the heat dissipation fin.

14. The heat dissipation system of an electronic device according to claim 12, wherein the plurality of heat sources comprises an electronic chip corresponding to the first outlet and another electronic chip corresponding to the second outlet, the heat dissipation system of the electronic device further comprises a heat conduction element, a heat dissipation fin, another heat conduction element, and another heat dissipation fin, the electronic chip conducts heat to the heat dissipation fin via the heat conduction element, and the another electronic chip conducts heat to the another heat dissipation fin via the another heat conduction element.

15. The heat dissipation system of an electronic device according to claim 12, wherein the radial direction range of the first outlet has a central angle of 200 degrees.

16. The heat dissipation system of an electronic device according to claim 12, wherein the housing has a reference radial direction relative to the axis and parallel to a plane where the second outlet is located, and based on the reference radial direction and along a rotational direction of the impeller, a starting point of the first outlet is located at a position with a central angle of −20 degrees relative to the reference radial direction and an end point of the first outlet is located at a position with a central angle of 180 degrees relative to the reference radial direction.

17. The heat dissipation system of an electronic device according to claim 12, wherein the housing has a side wall separating into two structures, two opposite sides of one of the two structures form a start point of the first outlet and an end point of the second outlet respectively, and another two opposite sides of the other one of the two structures form an end point of the first outlet and a start point of the second outlet.

18. The heat dissipation system of an electronic device according to claim 12, wherein the housing has a side wall separating into two structures, one of the two structures is closer to the impeller than the other, and a side of the closer one structure has an tongue end, wherein the impeller and the housing form at least one divergent channel, the tongue end is a start point of the divergent channel and adjacent to the second outlet, and a diverging direction of the divergent channel is the same as a rotational direction of the impeller.

19. The heat dissipation system of an electronic device according to claim 12, wherein an air output of the second outlet is greater than an air output of the first outlet.

20. The heat dissipation system of an electronic device according to claim 12, wherein the second outlet is a planar outlet.

21. The heat dissipation system of an electronic device according to claim 12, wherein the housing has a plurality of first outlets in different radial directions, and the plurality of first outlets are respectively presented with different opening contours.

22. The heat dissipation system of an electronic device according to claim 12, wherein the housing has a plurality of first outlets in different radial directions, and the plurality of first outlets are respectively presented with different arc lengths.

23. The heat dissipation system of an electronic device according to claim 12, wherein the housing further has at least one guiding structure, located at the first outlet and extending away from the axis.

* * * * *